US006569781B1

(12) United States Patent
Dokumaci et al.

(10) Patent No.: US 6,569,781 B1
(45) Date of Patent: May 27, 2003

(54) METHOD OF FORMING AN ULTRA-THIN OXIDE LAYER ON A SILICON SUBSTRATE BY IMPLANTATION OF NITROGEN THROUGH A SACRIFICIAL LAYER AND SUBSEQUENT ANNEALING PRIOR TO OXIDE FORMATION

(75) Inventors: Omer H. Dokumaci, Wappingers Falls, NY (US); Richard D. Kaplan, Wappingers Falls, NY (US); Mukesh V. Khare, White Plains, NY (US); Suryanarayan G. Hegde, Hollowville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/054,078

(22) Filed: Jan. 22, 2002

(51) Int. Cl.$^7$ .................. H01L 21/265; H01L 29/76

(52) U.S. Cl. ............... 438/775; 438/783; 438/787; 438/530

(58) Field of Search ................ 438/407, 530, 438/585, 526, 775, 783, 787

(56) References Cited

U.S. PATENT DOCUMENTS

| | | | |
|---|---|---|---|
| 5,330,920 A | * 7/1994 | Soleimani et al. | 148/DIG. 118 |
| 5,596,218 A | * 1/1997 | Soleimani et al. | 257/325 |
| 5,891,798 A | * 4/1999 | Doyle et al. | 438/624 |
| 5,908,312 A | * 6/1999 | Cheung et al. | 438/287 |
| 6,040,216 A | * 3/2000 | Sung | 438/257 |
| 6,060,369 A | * 5/2000 | Gardner et al. | 438/407 |
| 6,255,169 B1 | * 7/2001 | Li et al. | 438/258 |
| 6,261,972 B1 | * 7/2001 | Tews et al. | 438/241 |
| 6,362,085 B1 | * 3/2002 | Yu et al. | 438/407 |
| 6,380,102 B1 | * 4/2002 | Oh | 438/770 |

OTHER PUBLICATIONS

"Study on Ultra–Thin Gate Dielectrics: Surface Preparation and Reliability". Lin, J. et al. Solid State and Integrated Circuit Technology, 1998 5th Int'l Conference Proceedings, pp. 120–122.*

"Performance and Reliability Assessment of Dual–Gate CMOS Devices with Gate Oxide Grown on Nitrogen Implanted Si Substrates". Chen. Y.Y. et al. Electron Devices Meeting, 1997 Int'l Technical Digest, pp. 639–642.*

"XPS Analysis of RTP Formed Ultrathin–Gate Oxynitride via Low Energy Nitrogen Implantation". Khoueir, A. et al. VLSI and CAD, 1999 6th Int'l Conference on ICVC, pp. 229–232.*

C. T. Liu et al., "Light Nitrogen Implant for Preparing Thin–Gate Oxides" IEEE Electron Device Letters, vol. 18, No. 3, Mar. 1997, pp. 105–107.

C. T. Liu et al., "High Performance 0.2 $\mu$m CMOS with 25 Å Gate Oxide Grown on Nitrogen Implanted Si Substrates", IEEE 1996, pp. 499–502.

J. O. Bark et al. Formation of Ultrathin Gate Oxides with Low–Dose Nitrogen Implantation into Si Substrates, Electronic Letters 17$^{th}$ Sep. 1998 vol. 34 No. 19, pp 1887–1888.

* cited by examiner

Primary Examiner—Michael S. Lebentritt
Assistant Examiner—Beth E. Owens
(74) Attorney, Agent, or Firm—F. Chau & Associates, LLP

(57) ABSTRACT

A method for forming an oxide layer on a silicon substrate includes forming a sacrificial oxide layer on the silicon substrate, implanting nitrogen into the silicon substrate, annealing the silicon substrate having implanted nitrogen, removing the sacrificial oxide layer from the silicon substrate, and forming an oxide layer on the silicon substrate. The dose of nitrogen implanted into silicon is preferably higher than 1e14 cm$^{312}$. The annealing process is preferably performed at temperatures in a range from about 550° C. to about 1000° C. and for a time period between about 1 second and about 2 hours.

18 Claims, 3 Drawing Sheets

Substrate

Substrate

METHOD OF FORMING AN ULTRA-THIN OXIDE LAYER ON A SILICON SUBSTRATE BY IMPLANTATION OF NITROGEN THROUGH A SACRIFICIAL LAYER AND SUBSEQUENT ANNEALING PRIOR TO OXIDE FORMATION

BACKGROUND OF THE INVENTION

1. Field of the Invention

The present invention relates to a method of fabricating a thin oxide layer on a silicon substrate, more particularly, to a method of forming an ultra-thin oxide layer on a silicon substrate to be used as a gate oxide for a metal oxide semiconductor (MOS) device.

2. Description of the Related Art

In very large scale integration (VLSI) devices and in particular in metal oxide semiconductor (MOS) devices, as the length of the gate electrode and the thickness of the gate oxide are decreased, the MOS device can be switched at higher speed. However, decreases in the thickness of the gate oxide can result in larger amount of leakage current flow through the gate oxide, and an excessive amount of standby power may be dissipated. The leakage current varies exponentially with the thickness of the gate oxide.

One way to reduce the leakage current is to incorporate a high concentration of nitrogen into the gate oxide. The nitrogen in the gate oxide increases the dielectric constant of the gate oxide. Owing to the increase in the dielectric constant of the gate oxide, a film (e.g., oxynitride layer) thicker than a pure silicon oxide layer may be used as the gate oxide while maintaining an equivalent capacitive value. Thus, the leakage current in the gate oxide can be reduced by using the thicker film.

One way to introduce nitrogen into the gate oxide is to implant a high dose of nitrogen into a silicon substrate and subsequently grow the gate oxide on the nitrogen implanted silicon substrate.

However, as nitrogen dosage is increased above a certain amount, the thickness of the gate oxide is also increased. The threshold nitrogen dose is in a range from $1e15$ cm$^{-2}$ to $4e15$ cm$^{-2}$.

Accordingly, a need exists for a method of reducing leakage current in MOS devices using ultra thin gate oxides.

OBJECTS AND SUMMARY OF THE INVENTION

It is an object of the present invention to provide a method for forming an ultra-thin gate oxide on a silicon substrate for MOS devices where nitrogen is implanted in the silicon substrate.

It is another object of the present invention to provide a method for forming an ultra-thin oxide layer on a silicon substrate where the nitrogen implanted substrate is annealed so that the thickness of the oxide layer decreases.

It is still another object of the present invention to provide a method for forming an ultra-thin oxide layer on a silicon substrate where the nitrogen implanted substrate is annealed so that an amorphous layer formed due to the nitrogen implantation is recrystallized, wherein most of the implant damage is annealed out and most of the implanted nitrogen is still in the silicon substrate after the anneal.

To achieve the above and other objects, a method according to the present invention is provided for forming an oxide layer on a silicon substrate, comprising the steps of forming a sacrificial oxide layer on the silicon substrate, implanting nitrogen into the silicon substrate, annealing the silicon substrate having implanted nitrogen, removing the sacrificial oxide layer from the silicon substrate, and forming an oxide layer on the silicon substrate. The annealing step is preferably performed at temperatures in a range from about 550° C. to about 1000° C., more preferably, in a range from about 650° C. to about 900° C., and for a time period between about 1 second and about 2 hours, more preferably, for a time period between about 5 seconds and about 30 minutes. The annealing step is preferably performed in an inert gas ambient, more preferably, in a nitrogen or an oxygen ambient.

According to another aspect of the present invention, there is provided a method for forming an oxynitride layer on a silicon substrate, comprising the steps of implanting nitrogen into the silicon substrate, the nitrogen having a dosage above about $1e15$ cm$^{-2}$, annealing the silicon substrate at temperatures between about 550° C. and about 1000° C. for a time period between about 1 second and about 2 hours, wherein an amorphous layer in the silicon substrate created during nitrogen implantation is recrystallized and most of the implant damage is annealed out, and forming an oxynitride layer through oxidation of silicon. The annealing thermal budget should be chosen such that most of the nitrogen will not diffuse to the oxide/silicon interface.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiments with reference to the following figures wherein.

DESCRIPTION OF PREFERRED EMBODIMENTS

To solve the above and other problems of the conventional methods of fabricating thinner gate oxides, the present invention employs an annealing process which is preferably performed after nitrogen is implanted into a silicon substrate.

Figure 1A:
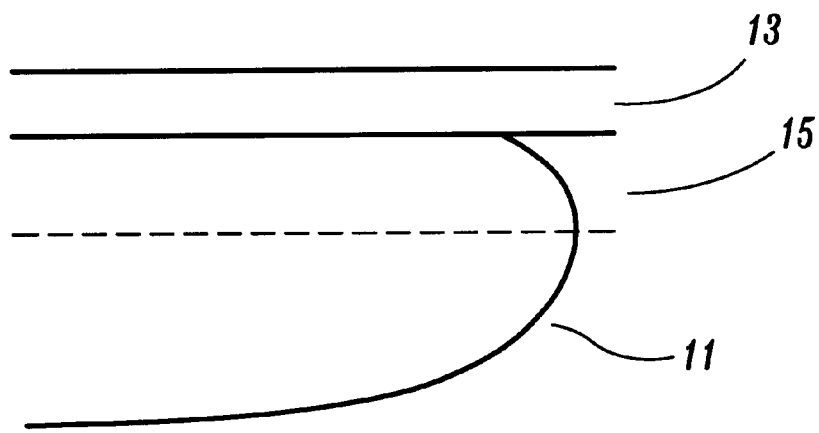
FIG. 1A is a cross-sectional view of an oxide layer and a silicon substrate into which nitrogen is implanted.
Figure 1B:
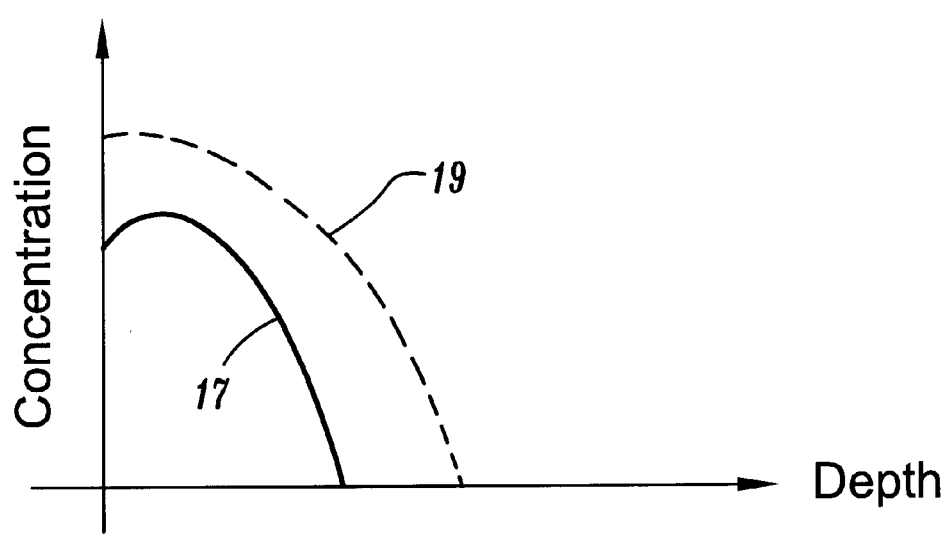
FIG. 1B is a graphical view showing the relationship between nitrogen and damage concentrations and the depth of the silicon substrate in FIG. 1A.

FIGS. 1A and 1B provide cross-sectional and graphical views to illustrate the concentration of nitrogen and implant damage on a silicon substrate caused by a high dose of nitrogen implantation. After a high dose of nitrogen is implanted into a silicon substrate, implant damage occurs on the silicon substrate so that an amorphous layer is formed in the silicon substrate.

Referring to FIG. 1A, nitrogen 11 is implanted into a silicon substrate through a sacrificial oxide layer 13. The dose of nitrogen may be above about 1e15 cm$^{-2}$. During nitrogen implantation, energetic implanted ions travel inside the silicon substrate until they come to rest. Collisions between the implanted ions and silicon atoms cause the silicon atoms to be displaced from their original crystalline lattice positions. The displaced silicon atoms can stop at sites that do not coincide with the original crystalline lattice positions. Any deviation from the original crystalline lattice is called "implant damage". The implant damage is in the form of interstitials, vacancies and its clusters right after the implant.

The implant damage causes the formation of an amorphous layer 15 in the nitrogen implanted silicon substrate. Unlike crystalline layers, the amorphous layer 15 is a layer that does not have any long range order. If the dose of nitrogen is high enough, the silicon substrate loses its crystallinity and becomes amorphous down to a certain depth.

FIG. 1B shows typical nitrogen 17 and interstitial/vacancy 19 concentrations after the nitrogen implantation. The interstitial/vacancy concentration is much higher than the nitrogen concentration because one nitrogen atom creates multiple interstitial/vacancy pairs until it comes to a stop.

When the oxide layer 13 is stripped off and new oxide is grown on the nitrogen implanted substrate by a oxidation process, the new oxide will grow thicker than normal if the nitrogen dose is high enough. Heavy implant damage and the amorphous layer increase the rate of oxidation. If the implant damage is heavy enough, the increase in oxidation rate will overwhelm the reduction in rate due to the presence of nitrogen and the resulting oxide layer will be thicker instead of being thinner. Such an increase in the thickness of the oxide layer prevents the formation of an ultra-thin oxide layer. In the present invention, the increase in the thickness of the new oxide layer is prevented by performing an annealing process after nitrogen implantation.

Figure 2A:
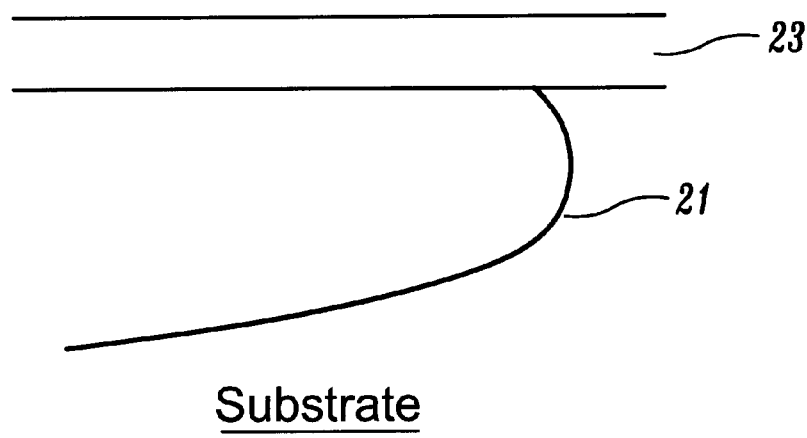
FIG. 2A is a cross-sectional view of an oxide layer and a nitrogen implanted silicon substrate which have been annealed according to the present invention.
Figure 2B:
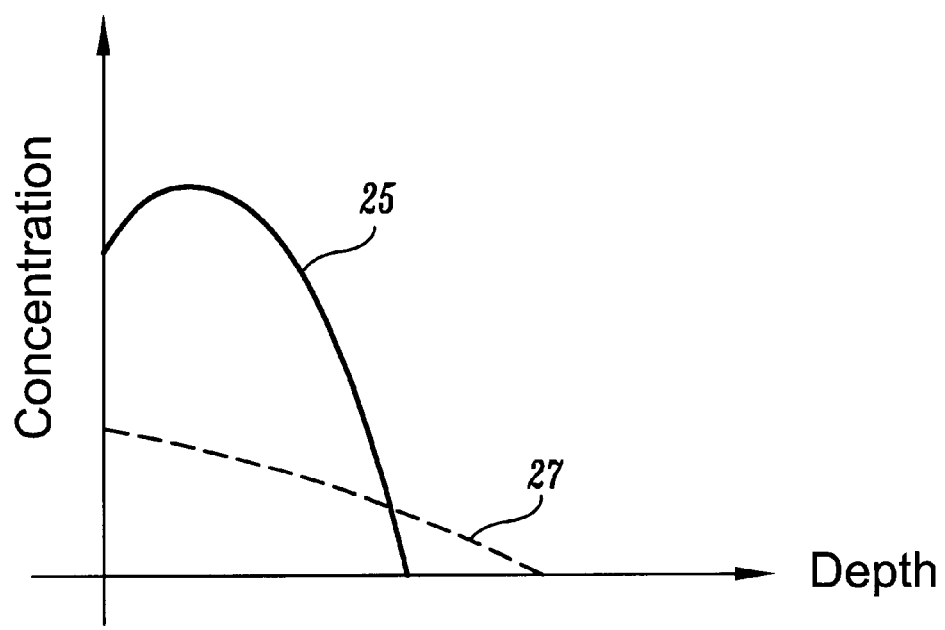
FIG. 2B is a graphical view showing the relationship between nitrogen and damage concentrations and the depth of the silicon substrate in FIG. 2A.

FIGS. 2A and 2B show the cross-sectional and graphical views for a nitrogen implanted silicon substrate after an anneal performed according to the present invention. In FIG. 2A, the amorphous layer is recrystallized under the sacrificial oxide layer 23 after the nitrogen 21 implanted silicon substrate is annealed. As illustrated in FIG. 2B, in the regions having high nitrogen concentration 25, the interstitial/vacancy concentration 27 after the annealing process is significantly less than that right after the nitrogen implantation. In addition, the time and temperature of the anneal is such that most of the nitrogen 25 is still in the silicon substrate. In other words, a significant amount of nitrogen has not diffused away either into the bulk or into the oxide/silicon interface. Such an optimized annealing process allows formation of an ultra-thin oxide layer with maximum nitrogen incorporation into the oxide. The thickness is preferably in the range from about 1 nm to about 4 nm, more preferably in the range from about 1 nm to about 2.5 nm.

Figure 3:
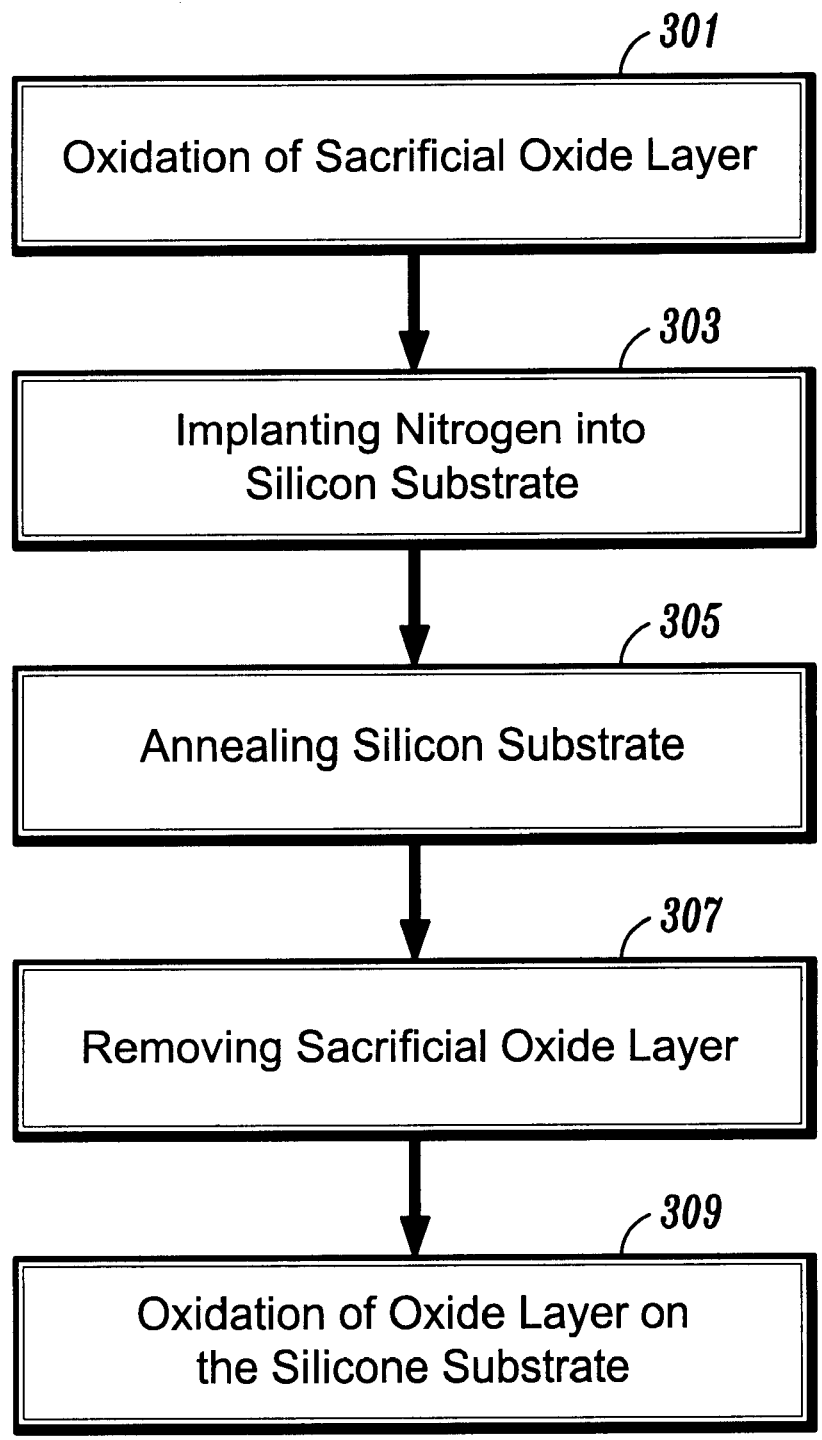
FIG. 3 is a flow chart for describing a method of forming an ultra-thin oxide layer on a silicon substrate according to the present invention.

Referring to FIG. 3, a flowchart is provided describing the method of forming an ultra-thin oxide layer on a silicon substrate according to the present invention. Upon a provided silicon substrate, a sacrificial oxide layer is grown by a oxidation process (step 301). Nitrogen implantation is done through the sacrificial oxide layer (step 303). Preferably, the nitrogen dose is in the range between about 1e14 cm$^{-2}$ and about 1e16 cm$^{-2}$; more preferably, in the range between about 1e15 cm$^{-2}$ and about 1e16 cm$^{-2}$. Also, nitrogen energy is preferably in the range from about 100 eV to about 200 keV. During the nitrogen implantation process, an amorphous layer may be formed in the silicon substrate due to the implant damage.

An annealing process is performed after the nitrogen is implanted into the silicon substrate (step 305). The annealing process is preferably performed after the nitrogen implantation and before formation of the thin oxide. During the annealing process, the amorphous layer formed due to the implant damage is recrystallized and the implant damage is significantly reduced. But, the annealing time and temperature are chosen such that most of the nitrogen still stays in silicon, i.e., does not diffuse to bulk or to silicon/oxide interface. The annealing process is preferably performed between about 550° C. and about 1000° C., more preferably in the range from about 650° C. to about 900° C. Also, the annealing process is preferably performed for a time period between about 1 second to about 2 hours, more preferably, between about 5 seconds and about 30 minutes. The annealing process is preferably performed in a nitrogen or oxygen gas ambient or any inert gas ambient such as argon (Ar), helium (He), etc.

After the annealing process, the sacrificial oxide layer is removed (step 307). The sacrificial oxide layer is etched off and the surface of the silicon substrate is cleaned. If the thermal budget of the previous annealing process is too high, a significant amount of nitrogen will be present at the silicon/oxide interface. This interfacial layer of nitrogen will be removed during the etching and cleaning processes. Then, the amount of nitrogen which will be incorporated into the oxide during the thin oxide formation step (step 309) will be reduced significantly. If such an excessive annealing occurs during the fabrication of MOS devices, there would only be minimal decrease in the leakage current of gate oxides. This is why the previous annealing step is optimized carefully to avoid nitrogen loss.

After performing the etching and cleaning processes in step 307, a thin oxide layer is grown on the silicon substrate via an oxidation process (step 309). The oxidation process is preferably performed at temperatures between about 700° C. and about 1100° C. and for a time period between about 1 second and about 2 hours. The ambient gas can be any oxidizing atmosphere, like $O_2$, $H_2O$ or any mixture of these gases with inert gases like $N_2$, He, Ar, etc.

During the oxidation process, the oxidation rate is reduced due to the significant decrease in the implant damage. In other words, since the implant damage which generally increases the oxidation rate is reduced by the annealing process, the oxidation rate decreases. Thus, the oxide layer becomes thinner and contains nitrogen that diffuses from the nitrogen implanted substrate to the interface between the substrate and the oxide layer. As a result, a thin oxynitride layer is formed on the silicon substrate.

In MOS devices where gate oxides are formed according to the present invention, the gate oxides are thinner than those formed without the nitrogen implantation and the annealing process of the present invention so that the MOS devices using the present invention have ultra-thin gate oxides.

Having described preferred embodiments of a method of forming an ultra-thin oxide layer on a silicon substrate according to the present invention, modifications and variations can be readily made by those skilled in the art in light of the above teachings. It is therefore to be understood that, within the scope of the appended claims, the present invention can be practiced in a manner other than as specifically described herein.

What is claimed is:

1. A method for forming an oxide layer on a silicon substrate, comprising the steps of:
   forming a sacrificial oxide layer on the silicon substrate;
   implanting nitrogen into the silicon substrate;
   annealing the silicon substrate having implanted nitrogen;
   removing the sacrificial oxide layer from the silicon substrate; and
   forming an oxide layer on the silicon substrate,
   wherein the oxide layer formed on the silicon substrate is an oxynitride.

2. The method of claim 1, wherein a dose of the nitrogen implanted into the silicon substrate is between about 1e14 cm$^{-2}$ and about 1e16 cm$^{-2}$.

3. The method of claim 1, wherein the annealing step is performed at temperatures in a range from about 550° C. to about 1000° C.

4. The method of claim 3, wherein the annealing step is performed at temperatures in a range from about 650° C. to about 900° C.

5. The method of claim 1, wherein the annealing step is performed for a time period between about 1 second and about 2 hours.

6. The method of claim 5, wherein the annealing step is performed for a time period between about 5 seconds and about 30 minutes.

7. The method of claim 1, wherein the annealing step is performed in an inert gas ambient.

8. The method of claim 1, wherein the annealing step is performed in a nitrogen or oxygen gas ambient.

9. The method of claim 1, wherein the annealing step is performed until an amorphous layer in the silicon substrate is recrystallized.

10. The method of claim 1, wherein a thermal budget in the annealing step is high enough that implant damage in the silicon substrate is substantially annealed out.

11. A method for forming an oxide layer on a silicon substrate, comprising the steps of forming a sacrificial oxide layer on the silicon substrate; implanting nitrogen into the silicon substrate; annealing the silicon substrate having implanted nitrogen; removing the sacrificial oxide layer from the silicon substrate; and forming an oxide layer on the silicon substrate, wherein a thermal budget in the annealing step is high enough that implant damage in the silicon substrate is substantially annealed out, and wherein the annealing thermal budget is low enough that most of the implanted nitrogen stays in the silicon substrate and does not diffuse to an interface between the silicon substrate and the oxide layer.

12. A method for forming an oxynitride layer on a silicon substrate, comprising the steps of:
   implanting nitrogen into the silicon substrate, doses of the nitrogen being in a range between about 1e14 cm$^{-2}$ and about 1e16 cm$^{-2}$;
   annealing the silicon substrate having implanted nitrogen at temperatures between about 550° C. and about 1000° C. for a time period between about 1 second and about 2 hours, wherein an amorphous layer in the silicon substrate created in the nitrogen implanting step is recrystallized during the annealing step; and
   forming the oxynitride layer through an oxidation of the annealed silicon substrate.

13. The method of claim 12, further including the steps of:
   forming a sacrificial oxide layer on the silicon substrate before the step of implanting nitrogen; and
   removing the sacrificial oxide layer from the silicon substrate after the annealing step.

14. The method of claim 12, wherein the annealing step is performed at temperatures in a range from about 650° C. to about 900° C.

15. The method of claim 14, wherein the annealing step is performed for a time period between about 5 seconds and about 30 minutes.

16. The method of claim 12, wherein the annealing step is performed in a nitrogen or oxygen gas ambient.

17. The method of claim 12, wherein a thermal budget in the annealing step is high enough that implant damage in the silicon substrate is substantially annealed out.

18. The method of claim 17, wherein the annealing thermal budget is low enough that most of the implanted nitrogen stays in the silicon substrate and does not diffuse to an interface between the silicon, substrate and the oxide layer.

* * * * *